(12) United States Patent
Elg

(10) Patent No.: US 6,771,514 B1
(45) Date of Patent: Aug. 3, 2004

(54) KEYED BUMPER DEVICE FOR ELECTRONIC CARD AND/OR BACKPLANE PROTECTION

(75) Inventor: Cedric Elg, Gilroy, CA (US)

(73) Assignee: Cisco Technology, Inc., San Jose, CA (US)

( * ) Notice: Subject to any disclaimer, the term of this patent is extended or adjusted under 35 U.S.C. 154(b) by 95 days.

(21) Appl. No.: 10/222,270

(22) Filed: Aug. 15, 2002

(51) Int. Cl.[7] .............................................. H01R 12/16
(52) U.S. Cl. ....................... 361/786; 361/787; 361/788; 439/633
(58) Field of Search ................................ 361/728, 736, 361/740, 741, 747, 748, 752, 756, 759, 785, 786, 787, 788, 791, 796, 801, 802, 807; 439/633, 680, 677

(56) References Cited

U.S. PATENT DOCUMENTS

| 3,533,045 A | * | 10/1970 | Henschen | 361/786 |
| 3,634,816 A | * | 1/1972 | Zell | 361/786 |
| 4,241,381 A | * | 12/1980 | Cobaugh et al. | 361/786 |
| 5,872,701 A | * | 2/1999 | Hayden, Sr. et al. | 361/786 |
| 6,385,053 B1 | * | 5/2002 | Parizi et al. | 361/786 |

* cited by examiner

Primary Examiner—Phuong T. Vu
(74) Attorney, Agent, or Firm—Blakely, Sokoloff, Taylor & Zafman LLP

(57) ABSTRACT

An apparatus for protecting an electronic card is described. The apparatus has a protective contact. The protective contact has a contact face that, when the apparatus is in a locked protruding state, makes contact with a first incorrect card slot backplane feature. In the locked protruding state, the contact face extends outward a first distance from a feature of the card that can receive resultant damage if the card is fully inserted into the incorrect card slot. The first distance is greater than a second distance between a second incorrect card slot backplane feature that can cause the resultant damage and the first incorrect card slot backplane feature. The apparatus includes a guide along which the protective contact slides in order to transition between the locked protruding state and a collapsed state. The protective contact extends less outward from the card in the collapsed state as compared to the locked protruding state so as to allow the card to be fully inserted into a correct card slot.

27 Claims, 6 Drawing Sheets

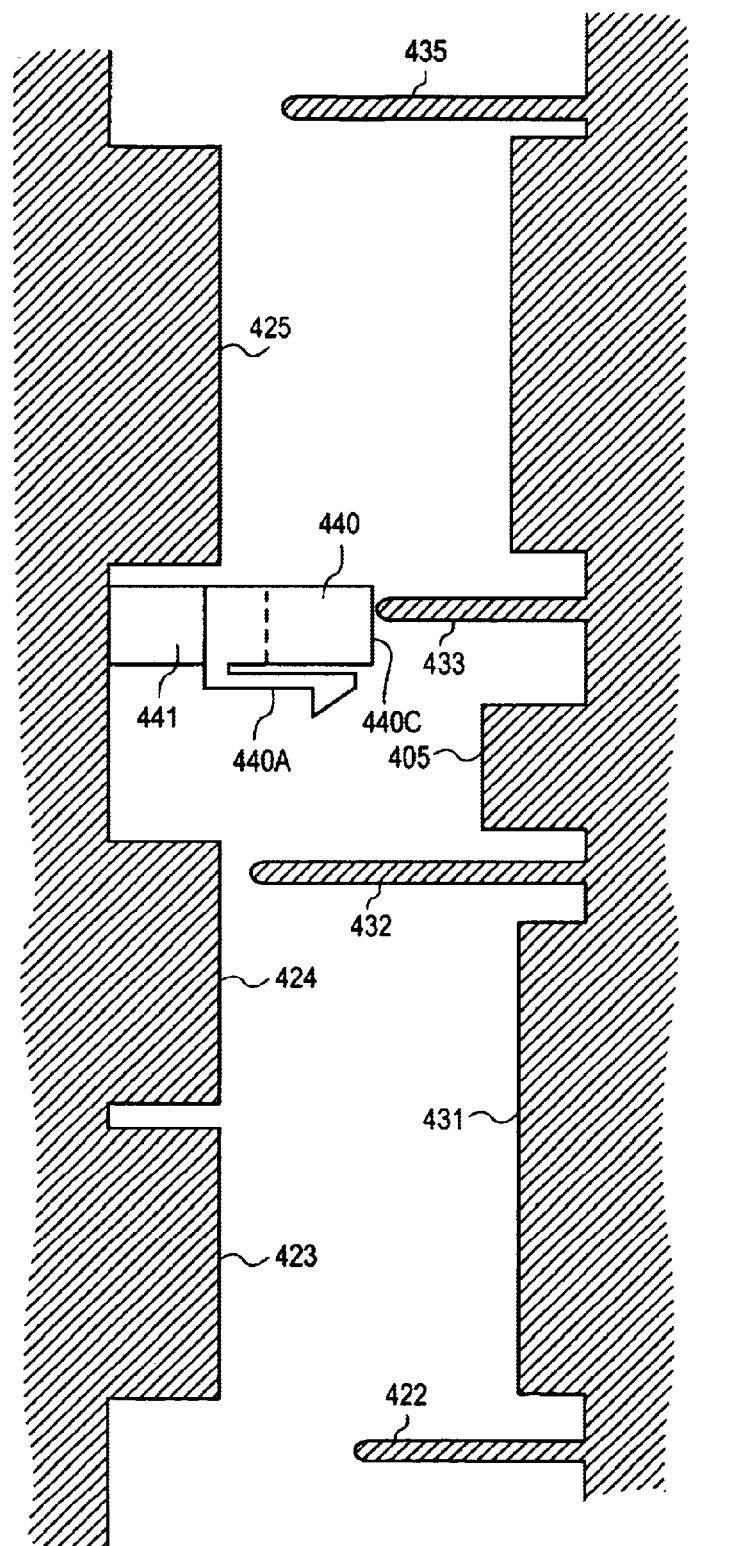

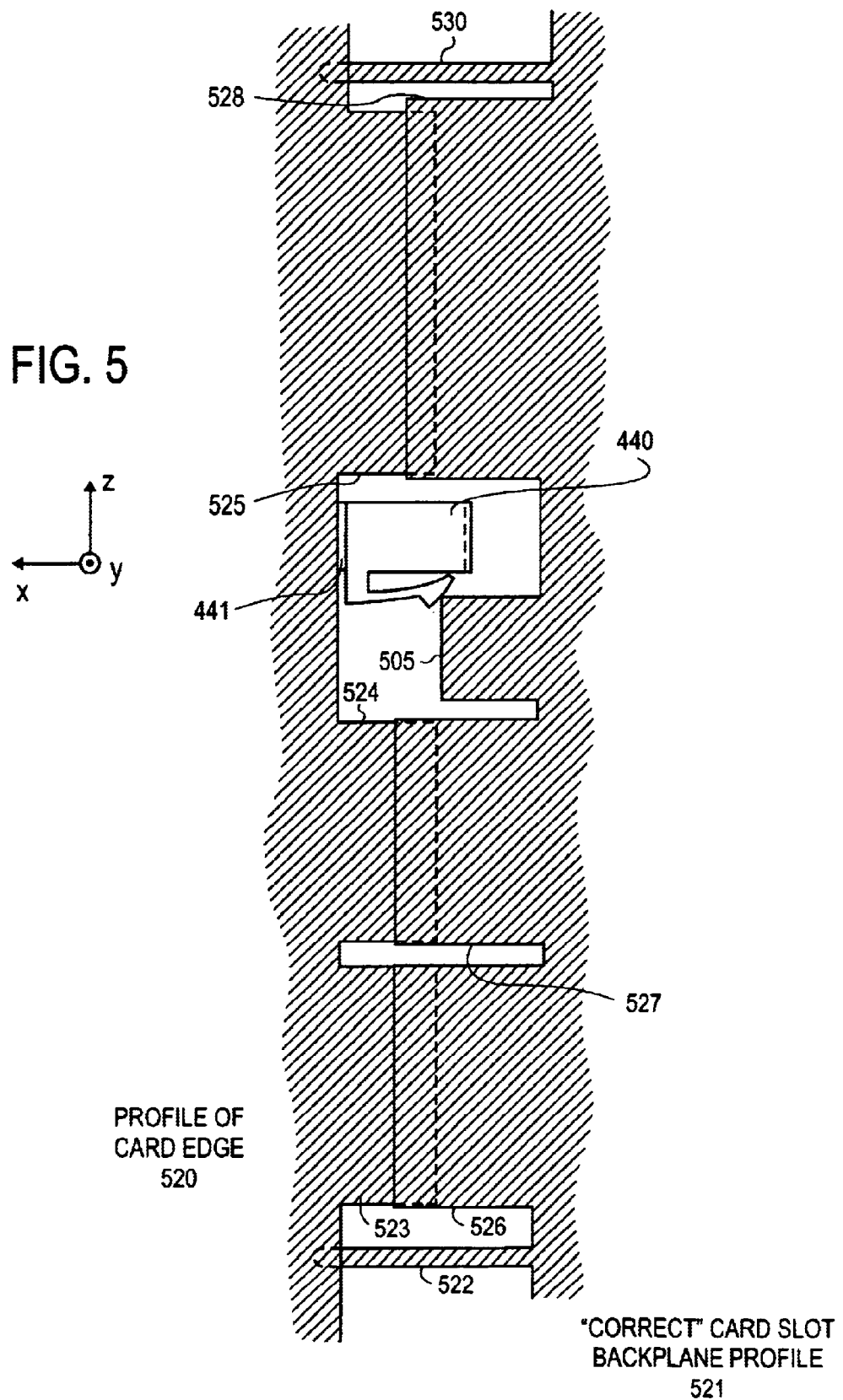

US 6,771,514 B1

KEYED BUMPER DEVICE FOR ELECTRONIC CARD AND/OR BACKPLANE PROTECTION

FIELD OF INVENTION

The field of invention relates to mechanical packaging for electronic systems, generally; and, more specifically, to a keyed bumper device for electronic card and/or backplane protection.

BACKGROUND

An electronic system is an interworking group of electric "cards" (also referred to as "blades", "PC boards" and the like). Each card typically has a plurality of semiconductor chips that, together, perform functions directed to the overall functionality of the card. For example, in the case of a networking electronic system, a Line Interface Card (LIC) is typically responsible for receiving streams of information over a copper or fiber optic cable and then converting these streams of information into a data format that is usable by another, "Switching" and/or "Routing" card. Switching and/ or Routing cards are generally responsible for identifying, for each received stream of traffic, another LIC (a "transmitting" LIC) that is appropriate for directing the traffic stream over an outbound copper or fiber optic cable.

The Switching and/or Routing card then directs each stream to its appropriate transmitting LIC. In this manner, incoming traffic streams are converted into outgoing traffic streams; and, as a consequence of the overall process, streams of traffic are directed to their proper destination. In order to assemble the electronic system into a cohesive whole, each card (e.g., the receiving LIC, the Switching and/or Routing card, and the transmitting LIC) "plugs into" a backplane unit. The backplane unit (hereinafter, "backplane") serves as a medium for transporting the various traffic streams between different cards; and, typically, provides some form of mechanical stability for the cards themselves. FIG. 1 shows a depiction of a mechanical package for an electronic system.

The mechanical package typically includes a box-like structure 100 having a front panel 100a with openings 102, 103, 104 where cards are inserted. The backplane 101 is usually placed within the box-like structure 100 opposite and facing the front panel 100a. From the embodiment of FIG. 1, note that ten different cards can be inserted into the mechanical package. That is, a card can be introduced to the electronic system by inserting it through the front panel 100 and sliding it along one of tracks 110 through 119. Each track 110 through 119 therefore corresponds to a different "card slot" into which a card can be inserted. When a card that is being inserted into a card slot reaches the back of the box 100 so as to meet the backplane 101, one or more connectors that are affixed to the card should line up and properly mate to one or more corresponding connectors that are affixed to the back plane.

Each of the connectors (whether on a card or on the backplane 101) typically contains a plurality of electronic connection units (e.g., pins and/or sockets) so that electrical signals can be properly transferred between the card and the backplane. FIG. 1 shows an embodiment of the backplane connectors for each of the ten card slots that tracks 110 through 119 correspond to. For example the backplane connectors for card slot 106 correspond to connectors 126, 127,128; and, the backplane connectors for card slot 108 correspond to connectors 131 and 134. Note that the collection of backplane connectors for card slots 106 and 107 are different than the collection of backplane connectors for the remaining card slots in the electronic system.

Different card connector patterns as between different card slots may naturally arise when certain card slots are reserved for certain types of cards. For example, with respect to the embodiment of FIG. 1, card slots 106 and 107 may be reserved for Switching and/or Routing cards while the remaining card slots (that correspond to tracks 110–113 and 116–119) may be reserved for LIC cards. Here, given that the Switching and/or Routing cards perform a different function than that performed by the LIC cards, the design of each type of card may drive a different footprint to the backplane 100. As such, the design and manufacture of the backplane 100 will include card slots 106,107 reserved for the Switching and/or Routing cards that are different (with respect to the footprint pattern and/or the types of connectors employed) than those reserved for the LIC cards.

FIGURES

The present invention is illustrated by way of example and not limitation in the figures of the accompanying drawings, in which like references indicate similar elements, and in which:

FIG. 4 shows a depiction of a card that was inserted into an inappropriate card slot as it approaches connectors on a backplane and where the card has been affixed with a keyed bumper device;

FIG. 5 shows a depiction of a card that was inserted into an appropriate card slot as it approaches the connectors on a backplane and where the card has been affixed with a keyed bumper device;

DETAILED DESCRIPTION

Figure 1:
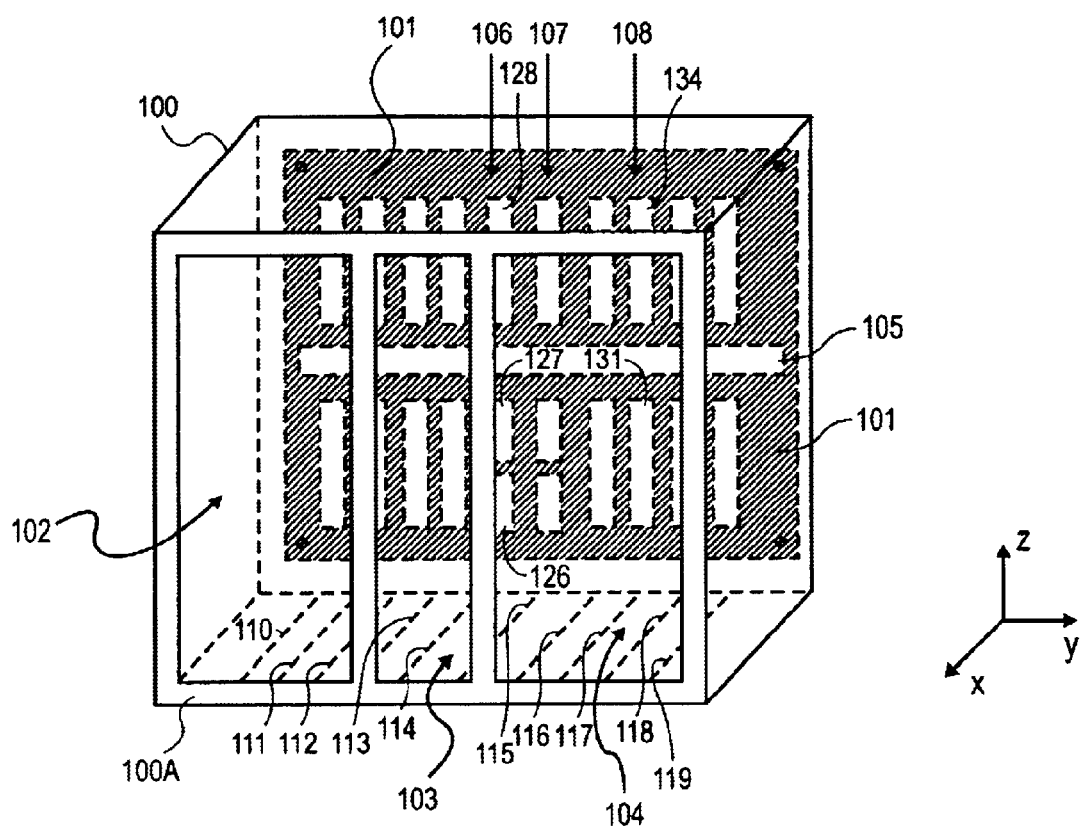
FIG. 1 shows an embodiment of a mechanical package for an electronic system.

When certain types of cards are reserved for specific card slots, problems may arise if a card of a certain type is inserted into the "wrong" card slot. FIG. 2 shows an embodiment of a certain type of card (e.g., a Switching or Routing card) that has been inserted into its proper card slot and is approaching the backplane (by moving in the −x direction). Notice that the profile 220 of the edge of the card is properly aligned to a matching backplane profile 221. That is, each of card connectors 223, 224, 225 will properly mate to backplane connectors 226, 227, 228. Features 222 and 230 correspond to long power or ground pins that mate into holes built into the edge of the card 220 which are approximately positioned at locations 231 and 229. Feature 205 corresponds to a brace that spans the backplane and secures its position within the mechanical package. A clearer view of the brace 105 is observed in FIG. 1.

Figure 2:
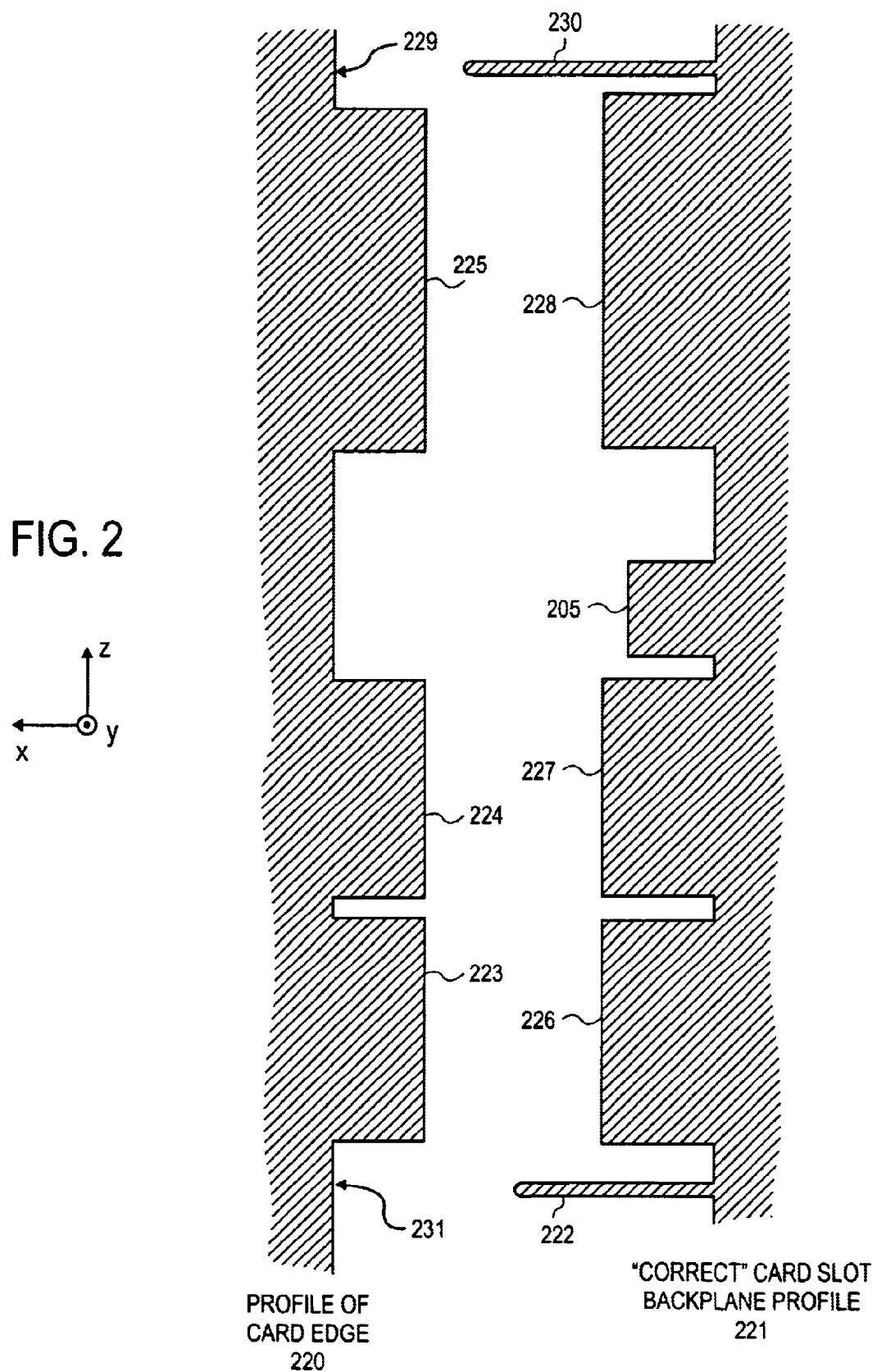
FIG. 2 shows a depiction of card that was inserted into an appropriate card slot as it approaches connectors on a backplane.

Comparing FIGS. 1 and 2, note that the backplane profile 221 of FIG. 2 approximately corresponds to the backplane footprint observed in FIG. 1 for card slots 106 and 107. That is, focusing on card slot 106, backplane connectors 126, 127, 128 of FIG. 1 can be viewed as respectively corresponding to backplane connections 226, 227, 228 of FIG. 2. As such, continuing with the exemplary application of the mechanical package observed in FIG. 1 that was discussed in the preceding background section, the card associated with edge profile 220 of FIG. 2 may be viewed as a Switching and/or Routing card that is being properly inserted in card slot 106 of FIG. 1.

Figure 3:
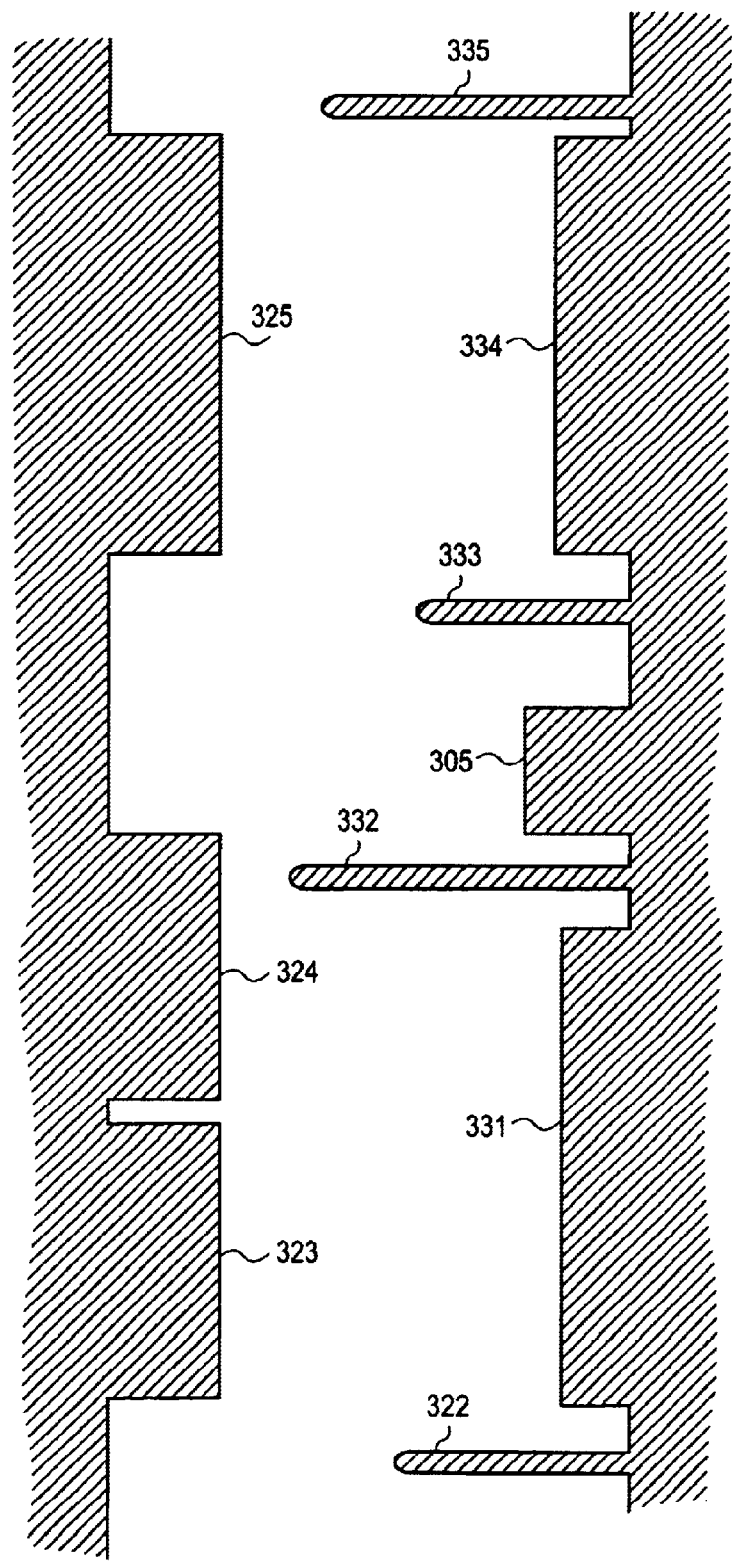
FIG. 3 shows a depiction of a card that was inserted into an inappropriate card slot as it approaches connectors on a backplane.

FIG. 3 shows an exemplary depiction of the applicable profiles 320, 321 if the same Switching and/or Routing card of FIG. 2 is improperly inserted into one of the LIC card slots. For example, backplane profile 321 of FIG. 3 may be viewed as corresponding to card slot 108 of FIG. 1. As such, backplane connectors 331 and 334 of FIG. 3 may be viewed as corresponding to backplane connectors 131 and 134 of FIG. 1. The depiction of FIG. 3 can therefore be viewed more specifically as a depiction of a Switching or Routing card 320 that is improperly being inserted into card slot 108. Because of the different backplane footprints that exist with respect to LIC card slots and Switching and/or Routing card slots, there is misalignment as between the connectors 323, 324, 325 associated with the card 320 and the overall backplane profile 321 of a LIC card slot.

In particular, note that the LIC card slot backplane interface 321 includes a long pin 332. Pin 332, in one embodiment, corresponds to a −48 v Return reference voltage that acts as a reference for a LIC DC/DC converter that supplies the DC voltage(s) used by the LIC card's constituent semiconductor chips. The use of a DC/DC converter allows a LIC to be "hot-plugged". Hot plugging is a feature where cards can be removed and/or inserted from/to the backplane while the overall electronic system is actively functioning. Allowing LIC cards to be inserted and removed while the overall system is actively functioning allows service personnel to change the configuration of the system while it is in the process of actively switching or routing "live" traffic.

As such, the entire system does not have to be "brought down" (thereby interrupting all traffic streams that flow through the system) while adding a LIC card or removing a LIC card from the system. Here, designing pin 332 to be longer than the other connectors 331, 334 or pins 322, 333, 335 ensures that, as a LIC card is being inserted into its card slot, the reference voltage for the LIC card's DC/DC converter (−48 v Return) is first established upon the LIC card. This, in turn, causes a favorable electrical condition with respect to both the safety of the electrical devices on the LIC card as well as potential disturbances caused to active electrical signaling that exists within the overall electronic system at the time the LIC card is making contact to the backplane. Both of these issues are a matter of concern when "hot-plugging" a card into an active electronic system.

Thus, with the understanding that hot-plugging may drive a backplane profile 321 design to have a long pin 332, note that long pin 332 can cause damage to card connector 324 if an attempt is made to fully insert the card associated with profile 320 into the backplane interface 321 observed in FIG. 3. For example, if connector 324 is a female type connector having a grid of holes where pins from connector 227 of FIG. 2 are to be inserted, the meeting of card profile 320 with backplane profile 321 will cause pin 332 to crush, distort or otherwise damage the holes associated with connector 324 (or their positioning within the grid to which they belong). If this were to occur, the Switching or Routing card associated with card profile 320 is damaged and results in the creation of economic waste.

In a foreseeable situation a field service person, after recognizing that the Switching and/or Routing card was improperly inserted into a LIC card slot (as observed in FIG. 3) and having caused damage to the card as a result, may subsequently attempt to insert the Switching and/or Routing card into an appropriate slot (such as card slot 106 or 107 of FIG. 1) without knowledge that the Switching/Routing card has been damaged by the earlier effort to fully insert it into a LIC card slot. This situation can be envisioned by referring back to FIG. 2. Here, however, recall that the holes associated with connector 224 (or their positioning within a grid) are damaged or distorted. When connector 224 is fully pressed against connector 227, the thin pins associated with connector 227 that attempt to mate with the damaged portion of connector 224 will become bent or otherwise damaged themselves. That is, as a proper hole does not exist for a pin to mate to, the pin will bend sideways as the field service person fully presses the Switching and/or Routing card into the backplane. This, in turn, damages the backplane which may require the installation of a completely new system.

FIG. 4 re-presents the situation of FIG. 3 (where a Switching and/or Routing card is incorrectly placed in a LIC card slot) in the case where a keyed bumper device has been affixed to the Switching and/or Routing card. The keyed bumper device, according to the embodiment of FIG. 4, includes a pair of pieces. A first piece 440 acts as a protective contact. That is, piece 440 makes contact with the backplane profile 421; and, protrudes sufficiently beyond the feature(s) of the card profile 420 (in the −x direction relative to the card) so as to prevent contact between the card features and the backplane. More specifically, with respect to the particular embodiment observed in FIG. 4, the protective contact 440 prevents long pin 432 of the backplane from making contact with card connector 424. As such, card connector 424 will not be damaged if a field service person incorrectly attempts to plug the Switching and/or Routing card into a LIC card slot. Here, the protective contact 440 can be viewed as a "bumper" that "bumps against" a backplane feature to prevent further movement of the card into an incorrect card slot.

The keyed bumper device may be viewed as having a pair of states: 1) a protruding state; and, 2) a collapsed state. Piece 441 of the keyed bumper device helps to achieve these pair of states. That is, piece 441 can be viewed as a guide along which the protective contact 440 slides. To reach the protruding state, noting that the keyed bumper device 441, 440 of FIG. 4 is shown as having already reached the protruding state, the protective contact 440 slides forward along the guide 441 relative to the profile 420 of the card (i.e., in the −x direction) so that the distance between the contact face 440c of the protective contact 440 (i.e., the portion of the protective contact 440 that makes contact with the backplane so as to prevent further movement of the card toward the backplane thereby protecting the card) and the contact face of the first portion of the card that becomes damaged if the card is fully inserted into an incorrect card slot (in this case the contact surface of connector 424) is greater than the distance between the portion of the backplane feature that causes damage to the aforementioned first portion of the card to be damaged (in this case, the tip of the long pin 432 that extends into the +x direction) and whatever other backplane feature the protective contact 440 is designed to make contact with (in this case, the tip of pin 433 that extends into the +x direction) in order to prevent damage to the card. Thus, when in the protruding state (e.g., as observed in FIG. 4), the keyed bumper device is suitably configured to prevent damage to the card if an attempt is made to plug it into an improper card slot. Note that, when in the protruding state, the protective contact 440 should be suitably rigid or fixed in position (e.g., "locked") so that even if a field service person attempts to "force" the card into the wrong card slot, the keyed bumper resists the force and protects the card in the process.

FIG. 5 shows the keyed bumper device in the collapsed state. The situation of FIG. 5 corresponds to a situation similar to that of FIG. 2 (where the card is being inserted into a correct card slot) - however, unlike FIG. 2, FIG. 5 illustrates a depiction where the card has been fully inserted into its correct card slot. As observed from FIG. 5, the keyed bumper device is designed to "collapse" from its protruding state to its collapsed state as a consequence of its being inserted into a correct card slot. Comparing the keyed bumper device configurations of FIGS. 4 and 5, note that the protective contact 440 has slid along the guide 441 in the +x direction relative to the guide 441. Here, a tab 440a is used to "trigger" the transition from a protruding state to a collapsed state. That is, when a backplane feature meets the tab 440a, the tab 440a moves (e.g., upward in the +z direction as observed in FIG. 5) so as to "unlock" the keyed bumper device from its protruding state; which, in turn, allows the protective contact 440 to collapse (i.e., slide "backward" along the guide 441) in the +x direction.

Referring to FIG. 4, note that the combination of the tab 440a design and the backplane profile 421 of an incorrect card slot prevents the tab 440a from being suitably moved so as to remove the keyed bumper device from its locked protruding state position. However, referring back to FIG. 5, note that the combination of the tab 440a design and the backplane profile 521 of a correct card slot allows the tab 440a to be suitably moved so as to remove the keyed bumper device from its locked protruding state position as the card is being installed. In particular, note that in the embodiment observed in FIG. 5, the tab 440a (having a sloped contact interface) is configured to press against the brace 505 structure (originally shown as brace 105 of FIG. 1) while the card is being inserted into a correct card slot; which, in turn, causes the tab 440a to move upward.

This, as described above, unlocks the keyed bumper from its protruding state and allows the protective contact 440 to easily slide "backward" (i.e., in the +x direction along the guide 441) as the card is being inserted into a correct card slot. As such, the card is allowed to fully mate with the backplane as observed in FIG. 5. Here, note that the overall device is "keyed" which invokes the notion that the device is designed such that specific backplane features: 1) cause the device to remain in a locked, protruding state when the card is inserted into an incorrect card slot (so as to prevent the card from being fully inserted into an incorrect card slot); and 2) cause the device to become "unlocked" from the protruding state when the card is inserted into a correct card slot (so that it suitably collapses into a position that allows the card to be fully inserted into a correct card slot).

Figure 6A:
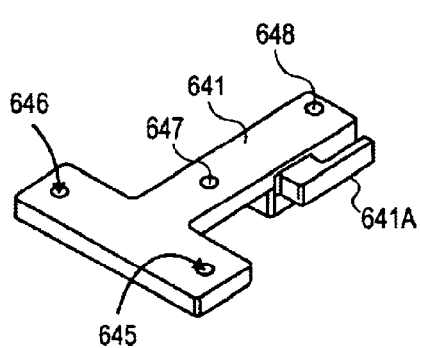
FIG. 6a shows a first piece of an embodiment of a keyed bumper device.
Figure 6B:
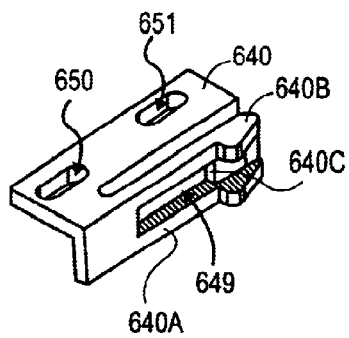
FIG. 6b shows a second piece of an embodiment of a keyed bumper device.
Figure 6C:
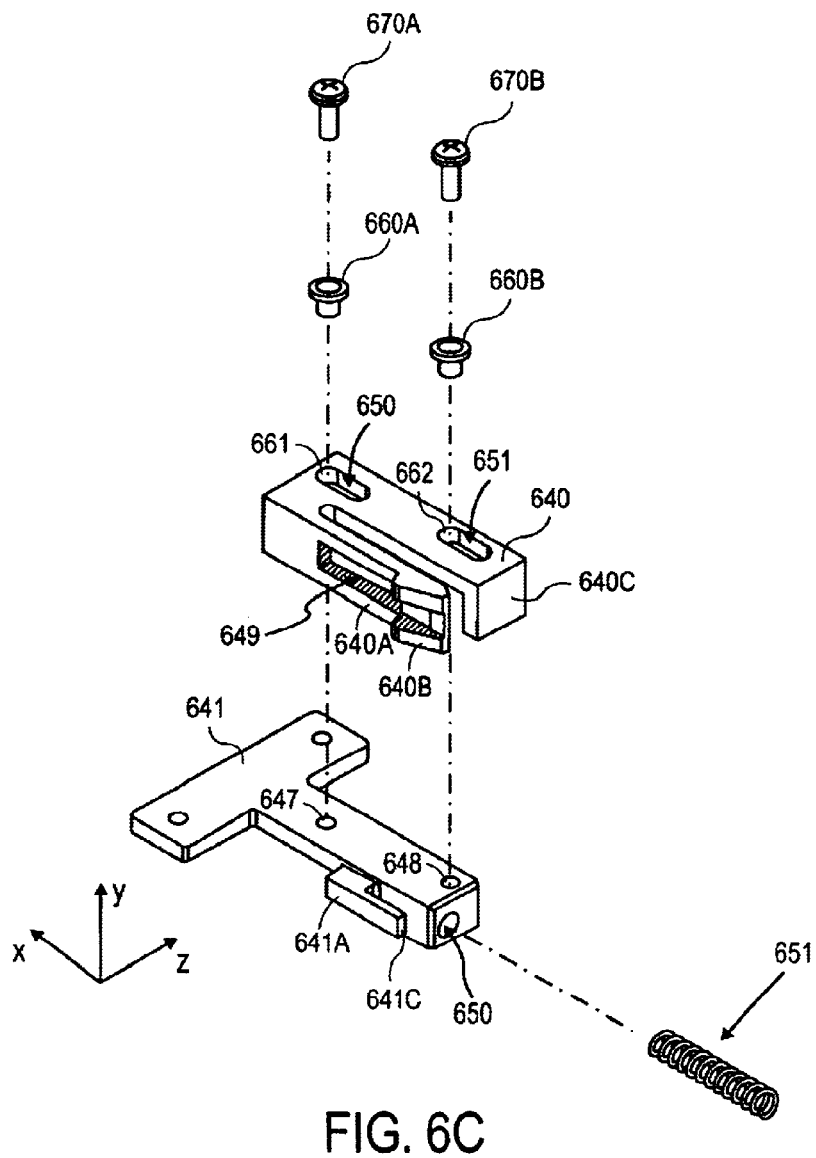
FIG. 6c shows an exploded view of an embodiment of a keyed bumper device.

FIGS. 6a through 6c show various perspectives of an embodiment for a keyed bumper device. FIG. 6a shows an embodiment of the guide 641; FIG. 6b shows an embodiment of the protective contact 640; and FIG. 6c shows an "exploded" view of an entire keyed bumper device assembly. A coordinate axis system has been provided for FIGS. 6a and 6b; and, a coordinate axis system has been provided for FIG. 6c. Both of these coordinate systems are aligned with their respective drawings so as to be consistent with the keyed bumper device drawings and coordinate systems that have already been observed in FIGS. 4 and 5. Referring to FIG. 6a, the guide embodiment 641 includes: 1) holes 645, 646 for mounting the guide to the card (by insertion of screws or bolts through the holes 645, 646); 2) holes 647, 648 for coupling the guide 641 to the protective contact 640; and, 3) a finger 641a that assists in the locking feature of the keyed bumper device.

Referring to FIG. 6b, the protective contact 640 includes: 1) the aforementioned tab 640a; 2) holes 650, 651 for coupling the protective contact 640 to the guide 641; and 3) a hole 649 within the tab 640b that assists in the locking feature of the keyed bumper device. With respect to holes 647, 648, 650, 651 for coupling the guide 641 and the protective contact 640 together; referring now to FIG. 6c, note that screw/spacer combinations 670a, 660a and 670b, 660b are used to couple the guide 641 and protective contact 640 together in manner that allows the protective contact to slide along the guide 641. Here, screws 670a, 670b and holes 647, 648 may be threaded so that the screws can be forcibly secured against spacers 660a, 660b so as to secure the protective contact 640 and guide 641 to one another. The height of the spacers 660a, 660b are configured to allow the protective contact 640 to freely slide along the guide 641 even though the protective contact 640 and guide 641 are secured to one another.

With respect to the locking feature of the keyed bumper device, the guide 641 and protective contact 640 are shaped such that finger 641a resides within hole 649 when the guide 641 and protective contact 640 are secured together as described just above. As such, when in a locked position, the front tip 641c of the finger (observed in FIG. 6c) can make contact with the inner face 640c of hole 649 (observed in FIG. 6b) which prevents the protective contact 640 from moving "backward" (i.e., in the +x direction) relative to the guide 641. However, when the sloped face 640b of the tab makes contact with a backplane feature (as observed in FIG. 5) the tab bends in the +z direction which mis-aligns the front tip 641c of the finger and the inner face 640c of hole 649 so that the just aforementioned contact ceases to exist. As such, the restriction on the protective guide's 641 ability to move in the +x direction is removed; which, in turn, allows the protective guide 640 to collapse from its, locked protruding state to the collapsed state observed in FIG. 5. Note that holes 650, 651 are oblong in order to allow the free movement of the protective contact 640 along the guide 641.

Note also that, referring to FIG. 6c, guide 641 also includes a hole 650 where a spring 651 is inserted. The spring 651 is compressed when the keyed bumper is in the collapsed state. As a result, pressure is applied against the protective tab 640 in the −x direction when the keyed bumper is collapsed. This effectively causes the keyed bumper to have, a "low energy" or "natural" state when the keyed bumper is in the locked, protruding position. This may be easily envisioned by referring to FIG. 5 and realizing that the spring is compressed when the keyed bumper device is collapsed as observed in FIG. 5. Here, if the card were to now be removed from the card slot, the spring's response would be to expand; which, in turn, would cause the protective contact 540 to leap forward in the −x direction ——ideally returning to the keyed bumper device to its locked, protruding state. Note that the movement of the protective guide 640 in the −x direction (responsive to the spring's expansion when the card is removed from its correct card slot) is limited by the "left" inner faces 661, 662 of the oblong holes 650, 651 (observed in FIG. 6c) of the protective guide 640. This sets the full extent in the −x direction of the protective contact 640 when the keyed bumper device is in its protruding state.

The spring 651 therefore causes the keyed bumper device to naturally exist within in its locked, protruding state. This should automatically protect the card even if the card were rapidly removed from a correct card slot to an incorrect card slot. Here, in order to help the keyed bumper device's automatic return to the protruding state, the protective contact 640 (or at least the tab 640*a*) should be made of a fairly "hard" or "rigid" material that is sufficiently resistive to the upward movement that was caused by the interaction with frame 505 when the card was pressed into its correct card slot. As such, when the card is subsequently pulled from its correct card slot, the sloped face 640*c* of the tab rapidly springs downward (in the −z direction) which causes inner face 640*c* to re-align with finger tip 641*c*. In an embodiment, the tab is made of lexan polycarbonate. In a further embodiment, the guide 641 and protective contact 640 are both made of polycarbonate (e.g., General Electric (GE) "Lexan" polycarbonate). In other embodiments other materials may be used such as acrylonitrile-butadiene-styrene (ABS) which may be partially glass filled for additional stiffness.

It is important to realize that the features or shapes of the protective tab, guide and applicable backplane profiles may vary from embodiment. As such, those of ordinary skill will be able to readily apply the teachings herein to applications that differ from the exemplary, specific application described just above. Therefore, note that a keyed bumper device can be applied to any type of electronic card that plugs into a backplane having suitably featured "correct" and "incorrect" backplane profiles. Furthermore, a keyed bumper device can be applied to cards other than Switching or Routing cards (e.g., LIC cards). Further still, a keyed bumper device can be affixed to cards associated with electronic systems other than networking systems (such as computing systems, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for protecting an electronic card, comprising:
   a) a protective contact having a contact face that, when said apparatus is in a locked protruding state, makes contact with a first incorrect card slot backplane feature, said contact face extending outward a first distance from a feature of said card that can receive resultant damage if said card is fully inserted into said incorrect card slot, said first distance greater than a second distance between a second incorrect card slot backplane feature that can cause said resultant damage and said first incorrect card slot backplane feature; and
   b) a guide along which said protective contact slides in order to transition between said locked protruding state and a collapsed state, said protective contact extending less outward from said card in said collapsed state as compared to said locked protruding state so as to allow said card to be fully inserted into a correct card slot.

2. The apparatus of claim 1 further comprising a spring between said guide and said protective contact that exerts an outward force on said protective contact so as to cause said keyed bumper device to naturally reside within said locked protruding state.

3. The apparatus of claim 2 further comprising a hole within said guide and that faces said protective contact, said spring placed into said hole.

4. The apparatus of claim 1 wherein said guide is affixed to said card.

5. The apparatus of claim 1 wherein said protective contact further comprises lexan polycarbonate.

6. The apparatus of claim 1 wherein said guide further comprises polycarbonate.

7. The apparatus of claim 1 wherein said protective contact further comprises ABS.

8. The apparatus of claim 1 wherein said guide further comprises ABS.

9. An apparatus for protecting an electronic card, comprising:
   a) a protective contact having a contact face that, when said apparatus is in a locked protruding state, makes contact with a first incorrect card slot backplane feature, said contact face extending outward a first distance from a feature of said card that can receive resultant damage if said card is fully inserted into said incorrect card slot, said first distance greater than a second distance between a second incorrect card slot backplane feature that can cause said result damage and said first incorrect card slot backplane feature;
   b) a guide along which said protective contact slides in order to transition between said locked protruding state and a collapsed state, said protective contact extending less outward from said card in said collapsed state as compared to said locked protruding state so as to allow said card to be fully inserted into a correct card slot; and
   c) a tab that stems from said protective contact that, when pressed against a correct card slot backplane feature, causes said apparatus to unlock from its locked protruding state so as to allow said apparatus to transition from said locked protruding state to said collapsed state.

10. The apparatus of claim 9 further comprising a spring between said guide and said protective contact that exerts an outward force on said protective contact so as to cause said keyed bumper device to naturally reside within said locked protruding state.

11. The apparatus of claim 9 wherein said guide is affixed to said card.

12. The apparatus of claim 9 wherein said protective contact further comprises lexan polycarbonate.

13. The apparatus of claim 9 wherein said guide further comprises polycarbonate.

14. The apparatus of claim 9 wherein said protective contact further comprises ABS.

15. The apparatus of claim 9 wherein said guide further comprises ABS.

16. The apparatus of claim 9 further comprising:
   a) a finger that stems from said guide; and
   b) a hole formed in said tab, said finger residing within said hole and pressing against an inner face of said hole when said apparatus is within said protruding locked state so as to prevent said protective contact from sliding toward said card, said tab being moved when said tab is said pressed against a correct card slot backplane feature so as to misalign said inner face and said finger which, as a consequence, allows said protective contact to slide toward said card so that said collapsed state can be reached.

17. An apparatus, comprising:
   an electronic system having a backplane that helps define a plurality of card slots, at least one of said card slots being an incorrect card slot relative to an electronic card that can be plugged into said electronic system, wherein, said card should not be plugged into said incorrect card slot, at least one of said card slots being a correct card slot relative to said card, wherein, when said card is plugged into said card slot said card is fitted with a keyed bumper device that is in a collapsed state, said keyed bumper device capable of reaching a locked protruding state so as to prevent said card from being fully inserted into said incorrect card slot if an attempt were made to fully insert said card into said incorrect card slot.

18. The apparatus of claim 17 wherein said apparatus is a networking system.

19. The apparatus of claim 17 wherein said apparatus is a computing system.

20. The apparatus of claim 17 wherein said keyed bumper device further comprises:

a) a protective contact having a contact face that, when said keyed bumper device is in said locked protruding state, makes contact with a first incorrect card slot backplane feature, said contact face extending outward a first distance from a feature of said card that can receive resultant damage if said card is fully inserted into said incorrect card slot, said first distance greater than a second distance between a second incorrect card slot backplane feature that can cause said resultant damage and said first incorrect card slot backplane feature; and, b) a guide along which said protective contact slides in order to transition between said locked protruding state and a collapsed state.

21. An apparatus for protecting an electronic card, comprising:

a) first means for making contact, when said apparatus is in a locked protruding state, with a first incorrect card slot backplane feature, said first means extending outward a first distance from a feature of a card that can receive resultant damage if said card is fully inserted into said incorrect card slot, said first distance greater than a second distance between a second incorrect card slot backplane feature that can cause said resultant damage and said first incorrect card slot backplane feature; and b) second means for guiding the sliding of said first contact, said sliding in order to transition said apparatus between said locked protruding state and a collapsed state, said first means extending less outward from said card in said collapsed state as compared to said locked protruding state so as to allow said card to be fully inserted into a correct card slot.

22. The apparatus of claim 21 further comprising third means that exerts an outward force on said protective contact so as to cause said keyed bumper device to naturally reside within said locked protruding state.

23. The apparatus of claim 21 wherein said guide is affixed to said card.

24. The apparatus of claim 21 wherein said protective contact further comprises lexan polycarbonate.

25. The apparatus of claim 21 wherein said guide further comprises polycarbonate.

26. The apparatus of claim 21 wherein said protective contact further comprises ABS.

27. The apparatus of claim 21 wherein said guide further comprises ABS.

* * * * *